(12) United States Patent
Brech et al.

(10) Patent No.: US 11,817,482 B2
(45) Date of Patent: Nov. 14, 2023

(54) SEMICONDUCTOR DEVICE AND METHOD

(71) Applicant: Infineon Technologies AG, Neubiberg (DE)

(72) Inventors: Helmut Brech, Lappersdorf (DE); Carsten Ahrens, Regensburg (DE); Matthias Zigldrum, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 247 days.

(21) Appl. No.: 16/997,980

(22) Filed: Aug. 20, 2020

(65) Prior Publication Data

US 2021/0057528 A1  Feb. 25, 2021

(30) Foreign Application Priority Data

Aug. 21, 2019  (EP) ..................... 19192898

(51) Int. Cl.
*H01L 29/78*  (2006.01)
*H01L 29/20*  (2006.01)
*H01L 21/02*  (2006.01)
*H01L 29/66*  (2006.01)
*H01L 29/778*  (2006.01)

(52) U.S. Cl.
CPC ...... *H01L 29/2003* (2013.01); *H01L 21/0254* (2013.01); *H01L 29/66462* (2013.01); *H01L 29/778* (2013.01); *H01L 29/78* (2013.01); *H01L 29/7786* (2013.01)

(58) Field of Classification Search
CPC ....... H01L 29/20; H01L 29/66; H01L 29/205; H01L 29/78; H01L 29/778; H01L 29/7786; H01L 23/481; H01L 23/5384; H01L 29/2003
See application file for complete search history.

(56) References Cited

U.S. PATENT DOCUMENTS

| | | | |
|---|---|---|---|
| 7,253,091 B2 | 8/2007 | Brewer et al. | |
| 9,177,893 B2* | 11/2015 | Mauder | ................... H01L 29/78 |
| 9,515,068 B1 | 12/2016 | Patterson et al. | |
| 9,929,107 B1* | 3/2018 | Birner | ................. H01L 29/7786 |

(Continued)

FOREIGN PATENT DOCUMENTS

EP  2731132 A2  5/2014

*Primary Examiner* — Younes Boulghassoul
*Assistant Examiner* — Quinton A Brasfield
(74) *Attorney, Agent, or Firm* — Murphy, Bilak & Homiller, PLLC

(57) ABSTRACT

A semiconductor device includes a composite layer having a first and second opposing surfaces. The composite layer includes a mesa and a first insulating layer. The mesa has top and bottom surfaces and side faces. The side faces are embedded in the first insulating layer. The mesa includes a Group III nitride-based multilayer structure providing a Group III nitride based device having first and second electrodes arranged on the mesa top surface. First and second outer contacts are positioned on the second surface of the composite layer. A first conductive via extends through the first insulating layer and is electrically coupled to the first electrode on the mesa top surface and to the first outer contact. A second conductive via extends through the first insulating layer and is electrically coupled to the second electrode on the mesa top surface and to the second outer contact.

13 Claims, 6 Drawing Sheets

(56) References Cited

U.S. PATENT DOCUMENTS

| | | | |
|---|---|---|---|
| 2011/0140172 A1 | 6/2011 | Chu et al. | |
| 2012/0292757 A1* | 11/2012 | Mauder | H01L 29/78 257/774 |
| 2014/0097441 A1 | 4/2014 | Schubert et al. | |
| 2014/0367700 A1* | 12/2014 | Prechtl | H01L 29/1075 257/77 |
| 2016/0005845 A1* | 1/2016 | Kim | H01L 29/78 257/194 |
| 2016/0343809 A1* | 11/2016 | Green | H01L 23/66 |
| 2017/0069743 A1* | 3/2017 | Roberts | H01L 29/7783 |
| 2018/0083107 A1* | 3/2018 | Birner | H01L 21/304 |
| 2018/0151742 A1* | 5/2018 | Kurata | H01L 27/14627 |
| 2018/0212047 A1* | 7/2018 | Chang | H01L 29/7786 |

\* cited by examiner

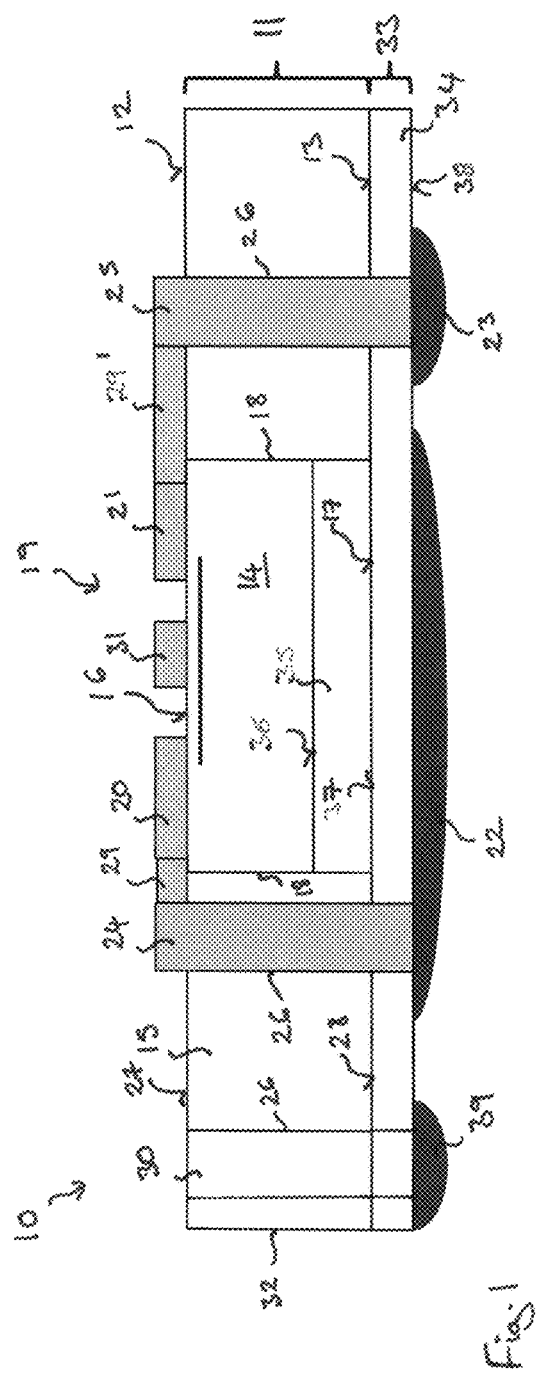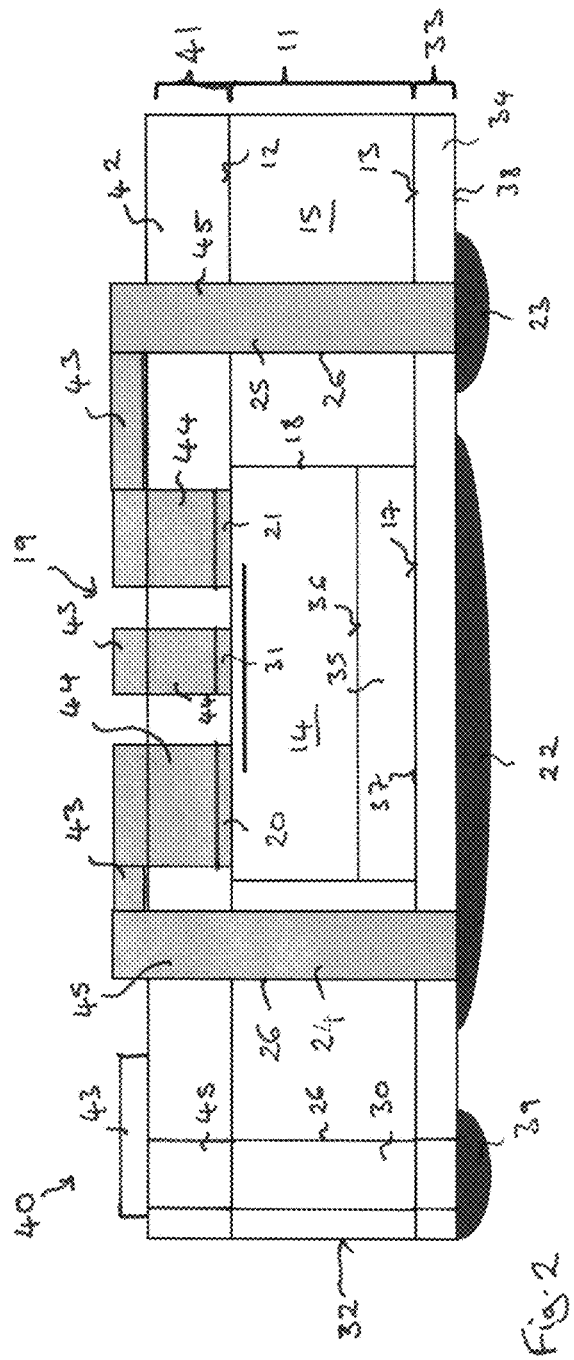

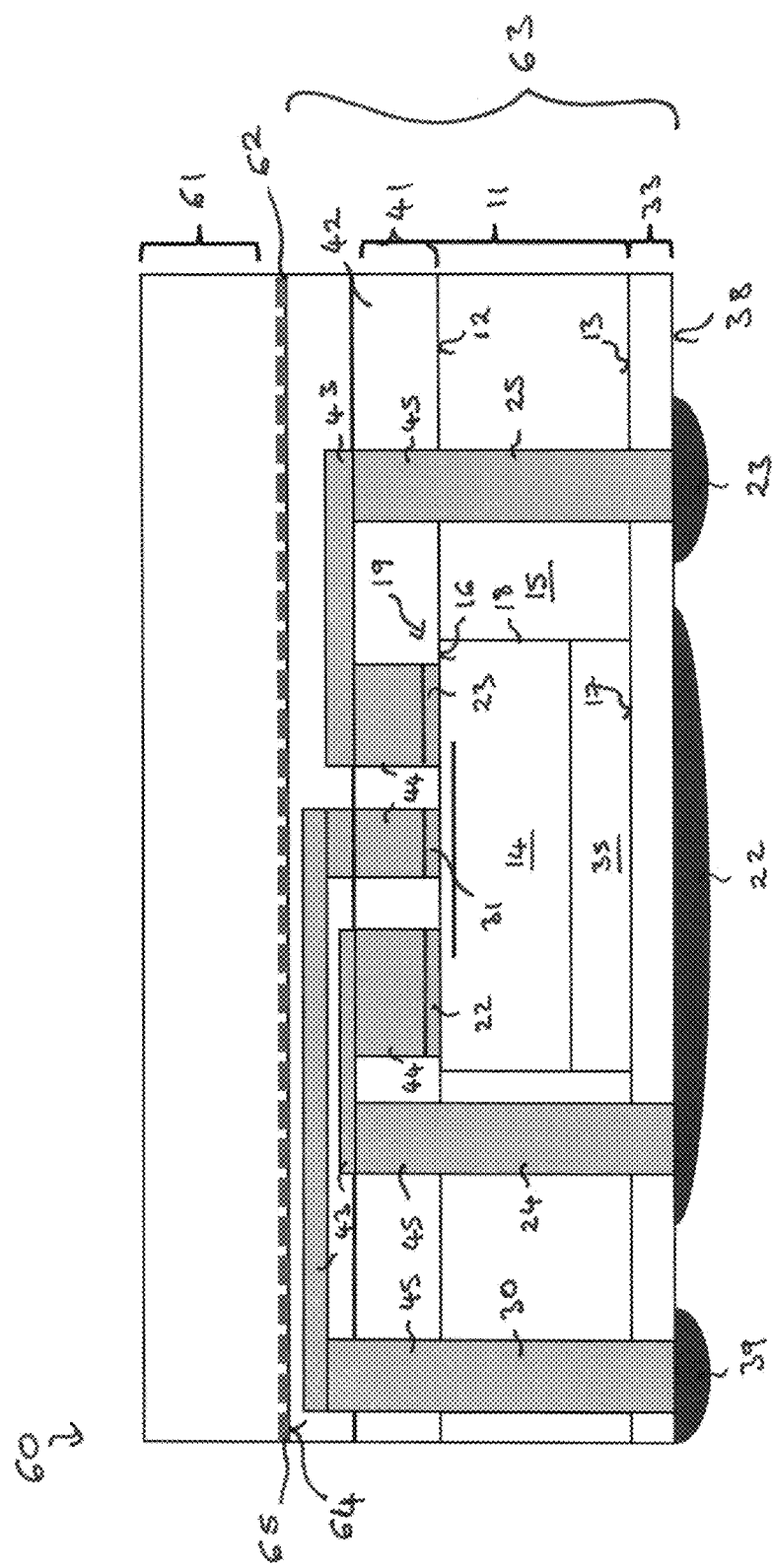

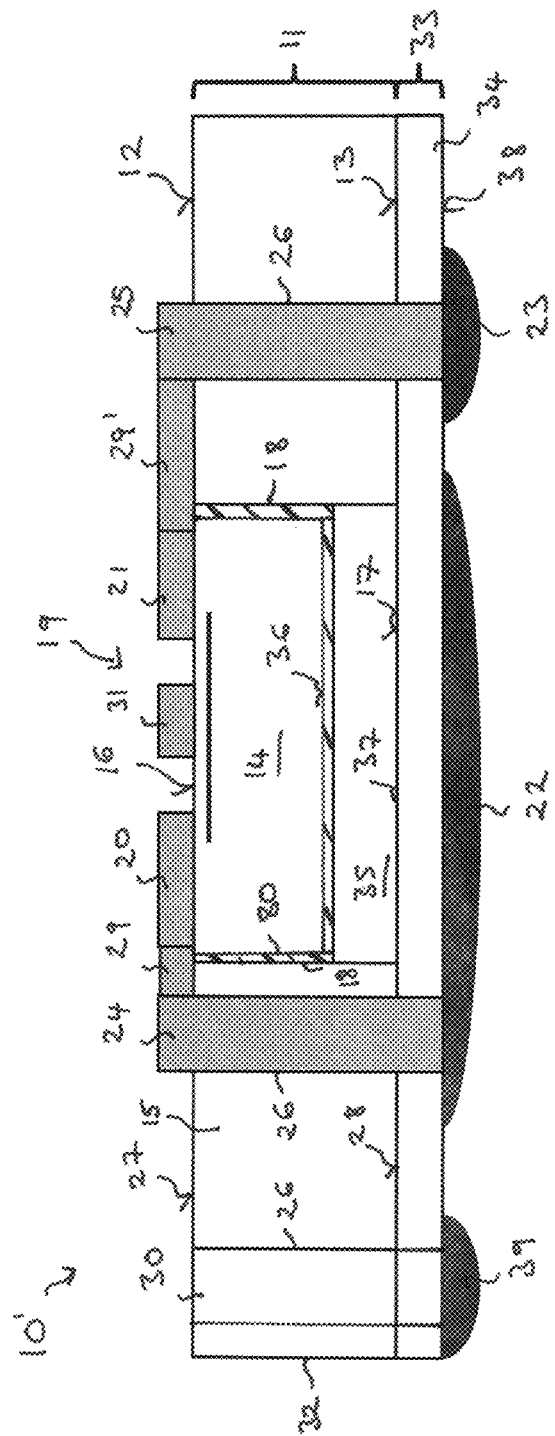

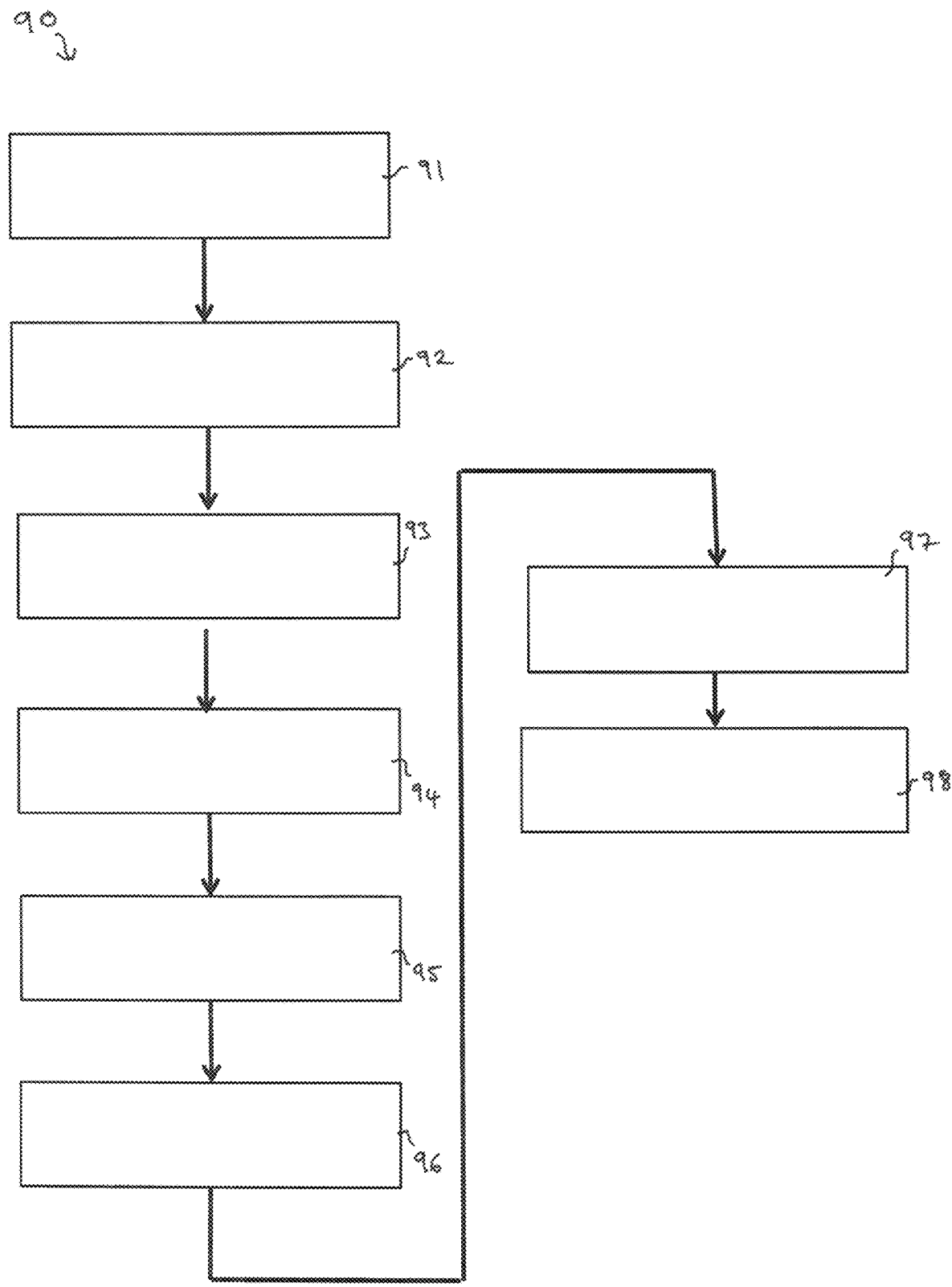

SEMICONDUCTOR DEVICE AND METHOD

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III-Nitride semiconductor devices, such as gallium nitride (GaN) devices, are now emerging as attractive candidates to carry large currents, support high voltages and to provide very low on-resistance and fast switching times.

The fast switching time of Group III-Nitride semiconductor devices may also find use in radio frequency applications, such as RF amplifying circuits.

However, further improvements in Group III-Nitride devices are desirable.

SUMMARY

According to the invention, a semiconductor device is provided that comprises a composite layer having a first surface and a second surface opposing the first surface, the composite layer comprising a mesa and a first insulating layer, the mesa having a top surface, a bottom surface and side faces, the side faces being embedded in the first insulating layer, wherein the mesa comprises a Group III nitride-based multilayer structure that provides a Group III nitride based device having a first electrode and a second electrode that are arranged on the top surface of the mesa, and the first insulating layer is formed of oxide and/or nitride material. The semiconductor device further comprises a first outer contact positioned on the second surface of the composite layer, a second outer contact positioned on the second surface of the composite layer, a first conductive via extending through the first insulating layer and electrically coupled to the first electrode on the top surface of the mesa and to the first outer contact positioned on the second surface of the composite layer and a second conductive via extending through the first insulating layer and electrically coupled to the second electrode on the top surface of the mesa and to the second outer contact positioned on the second surface of the composite layer.

In some embodiments, the mesa further comprises a base substrate, the base substrate having an upper surface capable of supporting the epitaxial growth of at least one Group III nitride and a lower surface forming the bottom surface of the mesa, wherein the Group III nitride-based multilayer structure is epitaxially formed on the upper surface of the base substrate.

The base substrate may be a foreign base substrate and comprise a material that is different from the material of the mesa, i.e. comprise a material other than a Group III nitride. The foreign base substrate has an upper surface that is capable of supporting the epitaxial growth of at least one Group III nitride.

In some embodiments, the foreign base substrate is a silicon base substrate, for example <111> silicon. In some embodiments, the foreign base substrate comprises sapphire or silicon, for example an epitaxially grown silicon layer on a further substrate, or silicon carbide, or a ceramic or a carbon-based substrate. The foreign base substrate has an upper surface that is capable of supporting the epitaxial growth of at least one Group III nitride.

In some embodiments, the first surface of the composite layer comprises the top surface of the mesa and a top surface of the insulating layer and the second surface of the composite layer comprises the bottom surface of the mesa and a bottom surface of the insulating layer.

In some embodiments, the base substrate has a thickness a thickness t, the Group III nitride-based multilayer structure has a thickness $t_n$, wherein $t \le t_n$, and $0 \ \mu m \le t \le 20 \ \mu m$, or $0.1 \ \mu m \le t \le 2 \ \mu m$ or $1 \ \mu m \le t \le 2 \ \mu m$.

In some embodiments, the base substrate is a foreign base substrate that has a thickness a thickness t and the Group III nitride-based multilayer structure has a thickness $t_n$, wherein $t \le t_n$, and $0 \ \mu m \le t \le 20 \ \mu m$, or $0.1 \ \mu m \le t \le 2 \ \mu m$ or $1 \ \mu m \le t \le 2 \ \mu m$.

In some embodiments, the Group III nitride-based device is a transistor device comprising a source electrode, a drain electrode and a gate electrode, wherein the first electrode provides the source electrode and the second electrode provides the drain electrode.

In some embodiments, the semiconductor device further comprises a third conductive via positioned in the insulating layer, wherein the third conductive via is coupled to the gate electrode and to a third outer contact positioned on the second surface of the composite layer.

In some embodiments, the semiconductor device further comprises a first conductive redistribution layer arranged on the first surface of the composite layer. In some embodiments, the first conductive redistribution layer comprises a second insulating layer on the first surface of the composite layer, a first lateral conductive redistribution structure on the second insulating layer, a fourth conductive via extending through the second insulating layer that electrically couples the first electrode of the Group III nitride-based device to the first lateral conductive redistribution structure, and a fifth conductive via that electrically couples the first lateral conductive redistribution structure to the first conductive via.

In some embodiments, the first outer contact extends over the bottom surface of the mesa.

In some embodiments, the first outer contact comprises a metallic layer, one or more conductive bumps arranged on the metallic layer and optionally solder positioned on the conductive bumps, or the first outer contact comprises a metallic layer and solder positioned on the metallic layer.

In some embodiments, the semiconductor device further comprises a semiconductor wafer arranged on the first surface of the composite layer.

In some embodiments, the semiconductor wafer comprises at least one semiconductor device and a redistribution structure that is electrically coupled to the semiconductor device and, optionally, further electrically coupled to the Group III nitride-based device. The semiconductor device may be a CMOS device, or a bipolar device, or a passive device, or passive devices for impedance matching, or active devices as a pre-driver, a low noise amplifier or full receive path or CMOS logic for digital signal processing.

In some embodiments, the semiconductor device further comprises a parasitic channel suppression region positioned at the interface between the side faces of the mesa and the first insulating layer and/or in the mesa and/or at the bottom surface of the mesa. The parasitic channel suppression region comprises an amorphous layer or a polycrystalline layer or a high-defect density region and, optionally, further comprises implanted species, wherein the species comprise at least one of the group consisting of Ar, Kr, Xe, Ne, He, N, O, H, Fe, C, Si and Al.

According to the invention, a method of fabricating a semiconductor device is provided that comprises: epitaxially growing a multilayer Group III nitride structure on a first surface of a substrate, the first surface being capable of supporting the epitaxial growth of at least one Group III nitride layer; removing portions of the multilayer Group III nitride structure to form at least one mesa arranged on the first surface, each mesa comprising the epitaxial Group III nitride-based multi-layer structure and being laterally spaced part by a portion of the substrate; applying insulating material to the first surface of the substrate so that side faces of the mesa are embedded in the insulating material; forming a first electrode on the top surface of the mesa; forming a first via in the insulating material that extends from the top surface of the insulating material to the first surface of the substrate; inserting conductive material into the first via to form a first conductive via; applying an electrically conductive redistribution structure to the upper surface and electrically connecting the first conductive via to the first electrode; successively removing portions of a second surface of the substrate, the second surface opposing the first surface, exposing the insulating material and forming a worked second surface comprising the insulating material.

In some embodiments, the method further comprises removing portions of the first surface of the substrate such that an interface between the first surface of the substrate and the epitaxial Group III nitride-based multi-layer structure is positioned in and extends across a width of the mesa. The worked second surface comprises a region of the substrate laterally bounded by the insulating material.

In some embodiments, the method further comprises bonding a semiconductor wafer to the upper surface, wherein the semiconductor wafer is a bare semiconductor wafer or the semiconductor wafer comprises at least one semiconductor device, wherein, optionally, the at least one semiconductor device is electrically coupled to the Group III nitride-based device.

The substrate may be a foreign substrate and comprise a material that is different from a Group III nitride. The foreign substrate has an upper surface that is capable of supporting the epitaxial growth of at least one Group III nitride.

In some embodiments, the foreign substrate is a silicon substrate and may be a monocrystalline silicon substrate. In some embodiments, the foreign substrate is <111> silicon. In some embodiments, the substrate comprises sapphire or silicon, for example an epitaxially grown silicon layer on a further substrate, or silicon carbide, or a ceramic or a carbon-based substrate. The substrate has an upper surface that is capable of supporting the epitaxial growth of at least one Group III nitride.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 1 illustrates a cross-sectional view of a semiconductor device according to an embodiment.

FIG. 2 illustrates a cross-sectional view of a semiconductor device according to an embodiment.

FIG. 4 illustrates a cross-sectional view of a semiconductor device according to an embodiment.

FIG. 6 illustrates a cross-sectional view of a semiconductor device with a parasitic channel suppression layer according to an embodiment.

FIG. 7 illustrates a flow chart of a method for fabricating a semiconductor device.

DETAILED DESCRIPTION

Figure 3A:
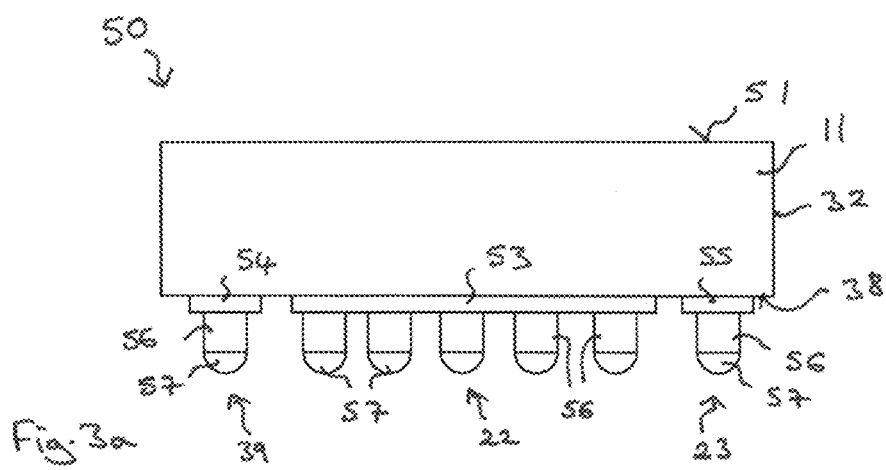
FIGS. 3a and 3b illustrate a side view and a bottom view, respectively, of a semiconductor device according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride $(GaAs_aP_bN_{(1-a-b)})_1$ and aluminum indium gallium arsenide phosphide nitride $(Al_xIn_yGa_{(1-x-y)}As_aPbN_{(1-a-b)})$, for example. Aluminum gallium nitride and AlGaN refers to an alloy described by the formula $Al_xGa_{(1-x)}N$, where $0<x<1$.

FIG. 1 illustrates a semiconductor device 10 that comprises a composite layer 11 comprising a first surface 12 and a second surface 13 that opposes the first service surface 12. The composite layer 11 comprises a mesa 14 and a first insulating layer 15. The mesa 14 has a top surface 16, a bottom surface 17 and side faces 18. The side faces 18 are embedded in the first insulating layer 15. The mesa 14 comprises a Group III nitride-based multilayer structure that provides a Group III nitride-based device 19. The first insulating layer 15 is formed of oxide and/or nitride material. For example, the first insulating layer 15 may comprise silicon oxide and/or silicon nitride.

The Group III nitride-based device 19 includes a first electrode 20 and a second electrode 21 arranged on the top surface 16 of the mesa 14. The semiconductor device 10 further includes a first outer contact 22 and a second outer contact 23 positioned on the second surface 13 of the composite layer 11. The semiconductor device 10 includes a first conductive via 24 which extends through the first insulating layer 15 and is electrically coupled to the first electrode 20 on the top surface 16 of the mesa 14 and to the first outer contact 22 positioned on the second surface 13 of the composite layer 11. The semiconductor device 10 also includes a second conductive via 25 which extends through the first insulating layer 15 and is electrically coupled to the second electrode 21 on the top surface 16 of the mesa 14 and to the second outer contact 23 positioned on the second surface 13 of the composite layer 11.

The composite layer 11 provides the body of the semiconductor device 10 having first and second major surfaces 12, 13 that are substantially parallel to one another and outer side faces that extend between the first and second major surfaces 12, 13. The body comprises an insulating material in the form of the first insulating layer 15 that laterally surrounds an island in the form of the mesa 14 of Group III nitride material.

The Group III nitride-based multilayer structure of the mesa 14 is free of vias including through vias. The conductive vias 24, 25 are laterally spaced apart from the side faces 18 of the mesa 14 by a portion of the first insulating layer 15. The sidewalls 26 of the first and second conductive vias 24, 25 and the side faces 18 of the mesa 14 are embedded within the first insulating layer 15. The mesa 14 is laterally uninterruptedly and continuously surrounded on all four sides by the insulating layer 15. The lateral area of the mesa 14 may be less than the lateral area of the insulating layer 15. In some embodiments, the width of the mesa 14 is less than the width of the insulating layer 15 on each of two opposing sides of the mesa 14.

In some embodiments, the top surface 16 of the mesa 14 and the upper surface 27 of the first insulating layer 15 are substantially coplanar and together form a substantially coplanar common surface that forms the first surface 12 of the composite layer 11. The insulating layer 15 also includes an opposing bottom surface 28 which may be substantially coplanar with the bottom surface 17 of the mesa 14 and form a common substantially coplanar surface that forms the second surface 13 of the composite layer 11.

The outer side faces 32 of the semiconductor device 10 may be formed entirely of the material of the first insulating layer 15 and, therefore, be formed of oxide and or nitride. In some embodiments, the first insulating layer 15 includes two or more sublayers. For example, the lower surface 28 of the insulating layer 15 may be formed of a nitride material and the upper surface 27 may be formed of an oxide material. The nitride layer may be significantly thinner than the oxide layer.

The outer contacts 22, 23 provide device contacts or package contacts that can be used to electrically couple the semiconductor device 10 to a higher level circuit board and other components. The semiconductor device 10 may also be called a wafer level package since the device can be made at the wafer level and singulated from the wafer to form the device illustrate in FIG. 1 without requiring further packaging of the semiconductor device 10. The second surface 13 of the composite layer 11 provides a support surface for a lower redistribution structure 33 and the first surface 12 provides the support surface of an upper redistribution structure.

In some embodiments one or both of the first and second outer contacts 22, 23 may be positioned underneath the mesa 14. For example, in the embodiment illustrated in FIG. 1, the first outer contact 22 extends onto and has a portion that is positioned on the and vertically underneath the bottom surface 17 of the mesa 14. In some embodiments one or both of the first and second outer contacts 22, 23 is positioned laterally adjacent the mesa 14, for example, the second outer contact 23 in the embodiment illustrated in FIG. 1 which is positioned on and vertically underneath the first insulating layer 15.

The semiconductor device 10 includes a conductive redistribution structure from the first and second electrodes 20, 21 positioned on the top surface 16 of the mesa 14 and the second surface 13 of the composite layer 11. The conductive vias 24, 25 provide a vertical redistribution structure between the two opposing surfaces 12, 13 of the composite layer 10.

The conductive redistribution structure may further include one or more lateral redistribution structures on the top surface 12. The first electrode 20 may be electrically coupled to the conductive via 24 by a first portion 29 of a lateral redistribution structure which extends from the electrode 20 over the first major surface 12 of the composite layer 11 to the first conductive via 24. Similarly, the second electrode 21 may be laterally coupled to the second conductive via 25 by a second portion 29' of a lateral redistribution structure which is positioned on the first surface 12 of the composite layer 11 and extends between the second electrode 21 and the second conductive via 25. A further conductive redistribution structure may be arranged on the opposing second surface 13 of the composite layer 11.

In some embodiments, the Group III nitride-based device 19 is a transistor device which further includes a gate electrode 31 which is positioned on the top surface 16 of the mesa 14 and which is laterally positioned between the first electrode 20 and second electrode 21. In these embodiments, the first and second electrodes 20, 21 form the source and drain electrodes, for example the first electrode 20 may be the source electrode and the second electrode 21 may be the drain electrode.

In embodiments in which the Group III nitride-based device 19 includes a third electrode 31, or more than three electrodes, the third electrode 31 may be electrically connected to one or more outer contacts 39 positioned on the opposing second surface 13 of the composite layer 11 by one or more third conductive vias 30 by a portion of the lateral conductive redistribution structure which is positioned outside the plane of the cross-sectional view FIG. 1.

Each mesa 14 may provide a semiconductor device, such as a transistor device, for example a High Electron Mobility Transistor (HEMT), a MISFET, a MIS-HEMT or a JFET. The transistor device may have an operating frequency of 800 MHz or more. In some embodiments, the mesa may provide a passive device.

In some embodiments, the Group III nitride-based transistor device is a high electron mobility transistor device (HEMT), which comprises a Group III nitride-based barrier layer having a first bandgap that is positioned on a Group III nitride-based channel layer having a second bandgap different from the first bandgap so that a heterojunction is formed between them which supports a two dimensional carrier gas, for example a two-dimensional electron gas (2DEG). The two dimensional carrier gas is indicated schematically in the drawings by a line. The Group III nitride-based channel layer may comprise gallium nitride and the Group III nitride-based barrier layer may comprise aluminium gallium nitride, for example. The Group III nitride-based channel layer may be positioned on a further buffer structure.

The epitaxial Group III nitride-based multilayer structure may include a stack of epitaxial Group III nitride layers. For a High Electron Mobility Transistor (HEMT), the epitaxial Group III nitride-based multilayer structure may include an epitaxial Group III nitride-based buffer structure, an epitaxial Group III nitride channel layer arranged on the Group III nitride buffer structure and an epitaxial Group III nitride barrier layer arranged on the Group III nitride buffer structure.

The Group III nitride-based multilayer structure may be epitaxially grown on a substrate that is later entirely removed or partially removed. For example, the substrate that is later entirely or partially removed may have a growth surface which is capable of supporting the epitaxial growth of one or more Group III nitrides. The substrate may be a foreign substrate, i.e. comprise a material that is different from a Group III nitride and has an upper surface that is capable of supporting the epitaxial growth of at least one Group III nitride. The substrate may comprise sapphire or <111> silicon. In other embodiments, the substrate comprises silicon carbide or a ceramic or a carbon-based substrate.

The Group III nitride-based buffer structure for a silicon substrate may include an AlN starting layer, which may have a thickness of several 100 nm, on the silicon substrate followed by a $Al_xGa_{(1-x)}N$ layer sequence, the thickness again being several 100 nm's for each layer, whereby the Al content of about 50-75% is decreased down to 10-25% before the GaN layer of AlGaN back barrier is grown. Alternatively, a superlattice buffer can be used. Again an AlN starting layer on the silicon substrate is used. Depending on the chosen superlattice, a sequence of AlN and $Al_xGa_{(1-x)}N$ pairs is grown, where the thickness of the AlN layer and $Al_xGa_{(1-x)}N$ is in the range of 5-15 nm. Depending on the desired breakdown voltage the superlattice may include between 20 and 100 pairs. Alternatively, an $Al_xGa_{(1-x)}N$ layer sequence as described above can be used in combination with the above mentioned superlattice.

In some embodiments, the substrate on which the Group III nitride structure was epitaxially grown is removed so that the mesa 14 does not include a base substrate with a growth surface for epitaxial growth of a Group III nitride. In these embodiments, the Group III nitride-based multilayer structure forms a part of the second surface 13 of the composite layer 11. The second surface 13 includes an island of Group III nitride material that is surrounded on all sides by the material of the first insulating layer 15. In other embodiments, In some embodiments, the outer contacts 22, 23, 39 of the semiconductor device 10 may be positioned directly on the second surface 13 of the composite layer 11 and therefore on the bottom surface 17 of the mesa 14 and on the lower surface 28 of the insulating layer 15. In other embodiments, a lower redistribution structure 33 is positioned on the second layer 13. The lower redistribution structure 33 may include one or more insulating layers 34 positioned on the second surface 13 and a conductive redistribution structure extending from the conductive vias 24, 25, 30 to the outer contacts 22, 23, 39. The outer contacts are then positioned on the lower surface 38 of the redistribution structure 33.

In some embodiments, the first and second vias 24, 25, 30 extend not only through the first insulating layer 15 of the composite layer 11 but also through the insulating material 34 of the lower redistribution structure 33. In some embodiments, the lower redistribution structure 33 includes separate conductive vias, each may be aligned with one of the conductive vias in the first insulating layer 15 or laterally offset from the conductive via in the first insulation layer 15 and electrically coupled to the conductive via in the first insulating layer 15 by a latera redistribution structure of the lower redistribution structure 33.

In some embodiments, the outer contacts of the semiconductor device, such as the outer contacts 22, 23, 39 are formed of solder. In other embodiments, the outer contacts comprise a conductive metal or alloy layer, which may have one or more sublayers, forming a contact pad. In some embodiments, the outer contacts 22, 23, 39 comprise a metal or alloy layer which may include one or more sublayers and a solder positioned on the metal or alloy layer. In some embodiments, the first and second contacts 22, 23, 39 may have the form of metal bumps which may also include an outer solder coating positioned on the bump. A combination of these forms may also be used for the outer contacts, such as a metal layer having an area on which solder is positioned or a metal layer on which one, two or more contact bumps, which may also include solder at the tip, are positioned.

The first electrode 20 may be electrically coupled by a plurality of first conductive vias 24 to a single outer contact 22, e.g. a contact pad, or may be electrically coupled by a plurality of conductive first conductive vias 24 to a plurality of first outer contacts 22. A single conductive via 24 may be connected to a single outer contact 22. Similarly, the second electrode 22 may be electrically coupled to a single second outer contact 23 by a plurality of conductive vias 25 or to a plurality of second outer contacts.

In some embodiments, such as that illustrated in FIG. 1, the mesa 14 further comprises a base substrate 35 which has an upper surface 36 that is capable supporting the epitaxial growth of at least one Group III nitride and a lower surface 37 that opposes the upper surface, the lower surface 37 forming the bottom surface 17 of the mesa 14. The base substrate 35 may be a foreign base substrate and is formed of a material that is different from a Group III nitride. In this embodiments, the base substrate 35 is a silicon base substrate.

The Group III nitride-based multilayer structure is epitaxially formed on the upper surface 36 of the silicon base substrate 35. The silicon base substrate 35 may have a thickness, t, that is less than the thickness, $t_n$, of the Group III nitride-based multilayer structure. For example, the thickness t of the silicon base substrate 35 may be less than 20 μm. In embodiments including the silicon base substrate 35, the silicon base substrate 35 may have a thickness t which lies in the range of 0.1 μm to 2 μm or between 1 μm and 2 μm.

In some embodiments, the silicon base substrate 35 may be removed completely after growth of the Group III nitride-based multilayer structure. In these embodiments, t=0.

The silicon base substrate 35 may include a monocrystalline foreign substrate such as a silicon <111> or <110> wafer. In other embodiments, the base substrate 35 may be a sapphire wafer or a SiC wafer or an epitaxial monocrystalline silicon layer. The silicon base substrate 35 may be a high resistivity silicon substrate with a bulk resistivity of bulk resistivity of greater than 10 Ohm·cm or greater than 100 Ohm·cm, or greater than 500 Ohm·cm or greater than about 1000 Ohm·cm.

The lateral extent of the silicon base substrate 35 is substantially the same as the lateral extent of the Group III nitride-based multilayer structure such that the side faces 18 of the mesa 14 are formed by silicon in the lower region and Group III nitride in the upper region and are substantially vertical and perpendicular to the first and second surfaces 12, 13. The side faces of the silicon base substrate 35 are, therefore, embedded in the oxide and/or nitride of the insulating layer 15. The second surface 13 of the composite layer 11 includes an island of silicon that is laterally surrounded by the material of the first insulating layer 15. The first insulating layer 15 forms a ring having a thickness that is substantially the same as the thickness as the mesa 14 and a width that extends from the side faces 18 of the mesa 14 to the outer side faces of the semiconductor device 10.

The conductive vias 24, 25 are positioned in the insulating layer 15 and do not pass through either Group III nitride material of the mesa 14 or the material of the substrate 35. In lateral planes arranged between the growth surface 36 of the substrate 35 and the first surface 12, the semiconductor device is free of monocrystalline silicon. In regions of the first insulating layer 15 that are unoccupied by the conductive vias 24, 25, the first insulating layer 15 extends without interruption from the side faces 18 of the mesa 14 to the outer side faces of the semiconductor device 10.

FIG. 2 illustrates a cross-sectional view of a semiconductor device 40 which includes a composite layer 11 comprising a mesa 14 and insulating layer 15 as in the semiconductor device 10 illustrated in FIG. 1. In the following, like features are denoted with like reference numbers.

In addition to the composite layer 11 forming the body of the device and the lower redistribution structure 22 arranged on the second surface of the composite layer 11, the semiconductor device 40 further comprises a first upper redistribution structure 41 arranged on the first surface 12 of the composite layer 11. The first redistribution structure 41 includes a second insulating layer 42 which is positioned on the first surface 12 of the composite layer and a first lateral conductive redistribution structure 43, which is positioned on and/or in the second insulating layer 42. The second insulating layer 42 extends over the top surface 16 of the mesa 14 and the upper surface 27 of the first insulating layer 15 and covers the entire lateral area of the composite layer 11.

The first redistribution structure 41 may comprise a plurality of lateral conductive redistribution structures and conductive vias. Each lateral conductive redistribution structure extends between one of the electrodes of the Group III nitride-based transistor device 19 formed in the mesa 14 and an associated outer contact by way of one or more conductive vias which extend at least through the thickness of the second insulating layer 42. The lateral conductive redistribution structures may be used to provide a more complex redistribution structure between the electrodes of the Group III nitride-based device 19 and the conductive vias positioned in the insulating layer 15 of the composite layer 11 than in in embodiments, such as that illustrated in FIG. 1, where the electrical connection between the electrodes 20, 21 and the conductive vias 24, 25, respectively, is positioned on the first surface 12 of the composite layer 11 without an intervening second insulating layer.

The first redistribution structure 41 including the second insulating layer 42 and the various lateral conductive redistribution structures and conductive vias may be fabricated at the wafer level before processing of the opposing second surface 13 of the composite layer 11 is carried out to form the outer contacts of the semiconductor device 40. In some embodiments, the first redistribution structure 41 is fabricated at the wafer level before the lower redistribution structure 33 on the second surface 13 of the composite layer 11 and the outer contacts 22, 23, 39 are fabricated. The lower redistribution structure 33 and outer contact 22, 23, 39 may also be fabricated at the wafer level, i.e. before singulation of the devices from the wafer.

As in the first embodiment illustrated in FIG. 1, in some embodiments, the mesa 14 includes a silicon base substrate having a lower surface 37 forming a part of the second surface 13. In other embodiments, the mesa 14 does not include a silicon base substrate such that the Group III nitride-based multilayer structure forms a part of the second surface 13 of the composite layer 11.

The first redistribution structure 41 further includes a fourth conductive via 44 that extends through the second insulating layer 42 to the first electrode 20 and electrically couples the first electrode 20 of the Group III nitride-based device 19 to a first portion of the first lateral conductive redistribution structure 43 and a fifth conductive via 45 that electrically couples the first portion of the lateral conductive redistribution structure 43 to the first conductive via 24. The fifth conductive via 45 and the first conductive via 24 may form a common conductive via and may be formed in a single process after the second insulating layer 42 has been deposited on the first surface 22 of the composite layer 11 and on the upper surface 27 of the insulating layer 15.

Similarly, the first redistribution structure 41 includes a sixth conductive via 44 that extends through the second insulating layer 42 to the second electrode 23 and electrically couples the second electrode 23 of the Group III nitride-based device 19 to a second portion of the first lateral conductive redistribution structure 43 and a seventh conductive via 45 that electrically couples the second portion of the lateral conductive redistribution structure 43 to the second conductive via 25 and an eighth conductive via 44 that extends through the second insulating layer 42 to the third electrode 31 and electrically couples the third electrode 31 of the Group III nitride-based device 19 to a third portion of the first lateral conductive redistribution structure 43 and a ninth conductive via 45 that electrically couples the third portion of the lateral conductive redistribution structure 43 to the third conductive via 30.

Figure 3B:
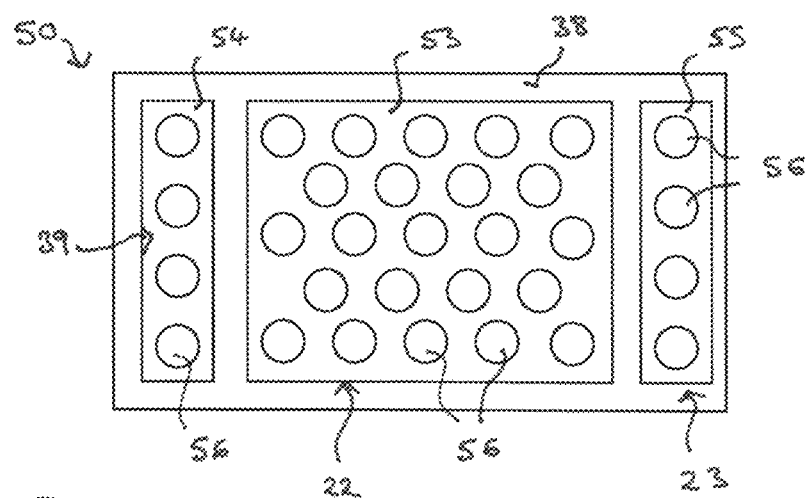

FIG. 3a illustrates a side view a semiconductor device 50 and FIG. 3b a plan view of the lower surface of the semiconductor device 50 according to an embodiment and illustrates an embodiment of a footprint which may be provided by the outer contacts 22, 23, 39 of the semiconductor device according to any one of the embodiments described herein.

The semiconductor device 50 includes a composite layer 11 with a mesa 14, not seen in the views of FIGS. 3a and 3b, having side faces embedded in a first insulating layer 15 and a lower redistribution structure 33 on the second surface 13 of the composite layer 11 having a surface 38 on which outer contacts 22, 23, 39 are positioned. The semiconductor device has an opposing upper surface 51 and side faces 32 formed from the material of the first insulating layer 15 which extend between lower surface 38 and the upper surface 51. The first surface 12 of the composite layer including the electrodes 20, 21, 31 and redistribution structure 29 may be covered by one or more passivation or insulating layers that form the upper surface 51 of the device 50. The side faces 32 are formed by the material of the insulating layer 15 of the composite layer 11 and may therefore be formed of an oxide, for example silicon oxide, or a nitride, for example silicon nitride, or an oxide and a nitride.

In the embodiment illustrated in FIGS. 3a and 3b, the outer contact 22 which is electrically coupled to one of the electrodes of the Group III nitride-based device 19, for example the first electrode 20 which may be a source electrode, comprises a first contact area 53 which is positioned towards the lateral centre of the lower surface 35 and vertically under the mesa 14. A second contact area 54 and a third contact area 55 are positioned on two opposing lateral sides of the first contact area 53. The second and third contact areas 54, 55 may each have an elongate form. The second contact layer 54 may be electrically connected to the second electrode 21 and to the drain electrode of Group III nitride-based transistor device 19 and the third contact area 55 may be electrically connected to the gate electrode 31 of the Group III nitride-based transistor.

As can be seen in the plan view of the lower surface 38 in FIG. 3b, a plurality of contact bumps 56 is positioned on each of the contact areas 53, 54, 55. The contact bumps 56 are arranged in a single row on each of the elongate second and third contact areas 54, 55. The contact bumps 56 are positioned in offset rows forming a hexagonal close packed arrangement on the larger first contact area 53. As can be seen in the side view of FIG. 3a, each of the tips of the contact bumps 56 is covered with a solder layer 57. The contact bumps 56 may be formed of a metal or alloy, for example may be copper bumps. The solder 57 may be a soft solder, typically for example, a lead-free solder.

Each of the electrodes may be electrically coupled to one of the contact areas by a plurality conductive vias. For example, a plurality of first conductive vias 24 that are electrically coupled to the first electrode 20 may be electrically coupled to the first contact area 53.

The outer contacts 22 provided by the plurality of bumps 56 which are connected to the first electrode 20 are positioned vertically underneath the mesa 14 whereas the bumps 56 arranged on the second and third contact areas 54, 55 are arranged vertically underneath the first insulating layer 15.

The first conductive redistribution layer 41 arranged on the first surface 12 of the composite layer 11 and/or the lower redistribution structure 33 positioned on the lower surface 13 of the composite layer 11 may be used to provide the electrical connections between the electrodes 20, 21, 31 of the Group III nitride-based device 19 within the mesa 14 and the outer footprint. The footprint of the semiconductor device may be different to that illustrated in FIGS. 3a and 3b.

In some embodiments, a more complex conductive redistribution structure may be provided on one both of the first surface 12 and second surface 13 of the composite layer 11 such that more than one additional insulating layer with intervening conductive layers may be provided on one or both of the first and second surfaces 12, 13 of the composite layer 11.

The semiconductor device according to any one of the embodiments described herein provides a surface mountable package for a lateral device in which the outer contacts of the package are positioned on the opposing surface to the electrodes of the lateral device. This surface mountable package can be fabricated at the wafer level by structuring a Group III nitride multilayer structure to form mesas 14 which are then packaged by embedding them in an insulating layer 15 that provides the side faces 32 of the package. Redistribution structures 29, 33 can be provided on the two opposing surfaces 12, 13 of the composited layer 11 with the conductive vias 24, 25, 30 being positioned in the insulating layer 15. This avoids the need for forming a via in the Group III nitride material and provides a vertical redistribution structure that is insulated on all sides by the first insulating material 15.

In the embodiments described herein, the area of the epitaxial Group III nitride is reduced due to the formation of mesas from the large area epitaxial Group III nitride multilayer structure. Furthermore, the thickness of the remaining silicon base substrate is reduced due to the thinning and even complete removal of the substrate on which the Group III nitride multilayer structure is grown. A semiconductor device with this combination of the Group III nitride device formed in a mesa or island and a thin substrate or even no substrate enables the electrical and thermal performance of the final semiconductor device to be improved, for example by minimizing parasitics of electrical interconnects, minimizing thermal resistance and maximizing flexibility of further fine-pitch processing, for example by full further processing in a typical CMOS factory.

In some embodiments, the semiconductor device including a composite layer comprising a mesa comprising a Group III nitride-based multilayer structure that provides a Group III nitride-based device and a first insulating layer formed of oxide and/or nitride material according to any of the embodiments described herein is used as a base semiconductor device 63. The base semiconductor device 63 can be used as part of a semiconductor device 60 that further comprises a further semiconductor wafer 61 or device arranged on the first surface 12 of the composite support layer 11. The semiconductor wafer 61 may be secured on the base semiconductor device 63, for example to the first surface 12 of the composite layer 11, by an adhesive or an oxide layer for example.

The use of a semiconductor wafer and semiconductor base device enables different semiconductor materials and different technologies to be used in a single device. Hybrid integration of different technologies, for example silicon-based technologies and Group III nitride-based technologies, allows the use of the optimum technology for a certain purpose.

In some embodiments, active or passive semiconductor devices, such as a Group III nitride-based transistor device, are formed in mesa island structures. The area between the mesa islands is filled with a different material, for example an insulating material or a dielectric such as an oxide and/or nitride. This structure is connected to the front side of a wafer of another technology.

Referring to FIG. 4, a semiconductor device 60 is shown which includes a semiconductor wafer 61 bonded to a base semiconductor device 63. The interface between the semiconductor wafer 61 and the underlying semiconductor device 63 is indicated by the dashed line 62. The underlying or base semiconductor device 63 may have the structure of the semiconductor devices 10, 40, 50 illustrated in FIGS. 1 to 3 or the structure according to any one of the embodiments described herein.

The semiconductor wafer 61 is arranged on the outermost surface 64 of the base semiconductor device 63. The outermost surface 64 may be the first surface 12 of the composite layer 11 or the first conductive redistribution layer 41 arranged on the first surface 12 of composite layer 11 or an outermost surface of a multilayer conductive redistribution layer structure arranged on the first surface 12 composite layer 11.

The semiconductor wafer 61 may be bonded to the outermost surface 64 of the base semiconductor device by an adhesive 65 or an oxide layer arranged at the interface 64. The semiconductor wafer 61 may be a bare semiconductor wafer and include no further semiconductor structures or semiconductor wafer 61 may include at least one semiconductor device. In some embodiments, the semiconductor wafer 61 is a monocrystalline semiconductor wafer, such as <100> silicon.

In some embodiments, the semiconductor wafer 61 comprises silicon having a different orientation to the orientation of the silicon base substrate 35 arranged at the base of the mesa 14 on the opposing side of the composite layer 11. For example, the upper surface 36 of the silicon base layer 35 of the mesa 14 may be formed from silicon having a <111> orientation, since this favours the epitaxial growth of Group III nitride, whereas the silicon wafer 61 may have a <100> orientation which is typically used for the fabrication of silicon-based semiconductor devices, for example CMOS devices. In these embodiments, the semiconductor device 60 may be described as a hybrid device.

In some embodiments, the semiconductor wafer 61 comprises silicon having a different orientation, e.g. <100>, to the orientation of the silicon base substrate or wafer, e.g. <111>, on which the mesa was epitaxially grown but which has been entirely removed and is no longer present in the base semiconductor device 63. In some embodiments, the semiconductor wafer 61 comprises a different composition, for example silicon to the composition of the substrate or wafer, e.g. sapphire, on which the mesa was epitaxially grown but which has been entirely removed and is no longer present in the base semiconductor device 63. This enables two different technologies to be used independently of one another so that technologies which typically cannot be used in a single device, for example, as they are incompatible in terms of thermal load, can be used to fabricate the device.

In embodiments in which the semiconductor wafer 61 comprises at least one semiconductor device, the semiconductor wafer 61 may further include a redistribution structure that is electrically coupled to the semiconductor device or devices within the semiconductor wafer 61. In some embodiments, the redistribution structure which is electrically coupled to the semiconductor device of the wafer 61 is further electrically coupled to one or more outer contacts positioned on the opposing side of the underlying base semiconductor device 63, i.e. on the second surface 13 of the composite layer 11 or lower surface 38 if a lower redistribution structure 33 is used, and/or further electrically coupled to the Group III nitride-based device 19 positioned within the mesa 14. For example, a silicon-based transistor device, such as a MOSFET, within the semiconductor wafer 61 may be electrically coupled to the Group III nitride-based transistor device 19 formed in the mesa 14 and to the outer contact 22 so as to form a circuit.

The type and number of devices included in the semiconductor wafer 61 can be chosen to provide a particular circuit or application. In other embodiments, the semiconductor wafer 61 may include a CMOS device, a bipolar device, a passive device, passive devices for impedance matching, an active device providing a pre-driver, a low noise amplifier, a full path or CMOS logic for digital signal processing.

Figure 5:
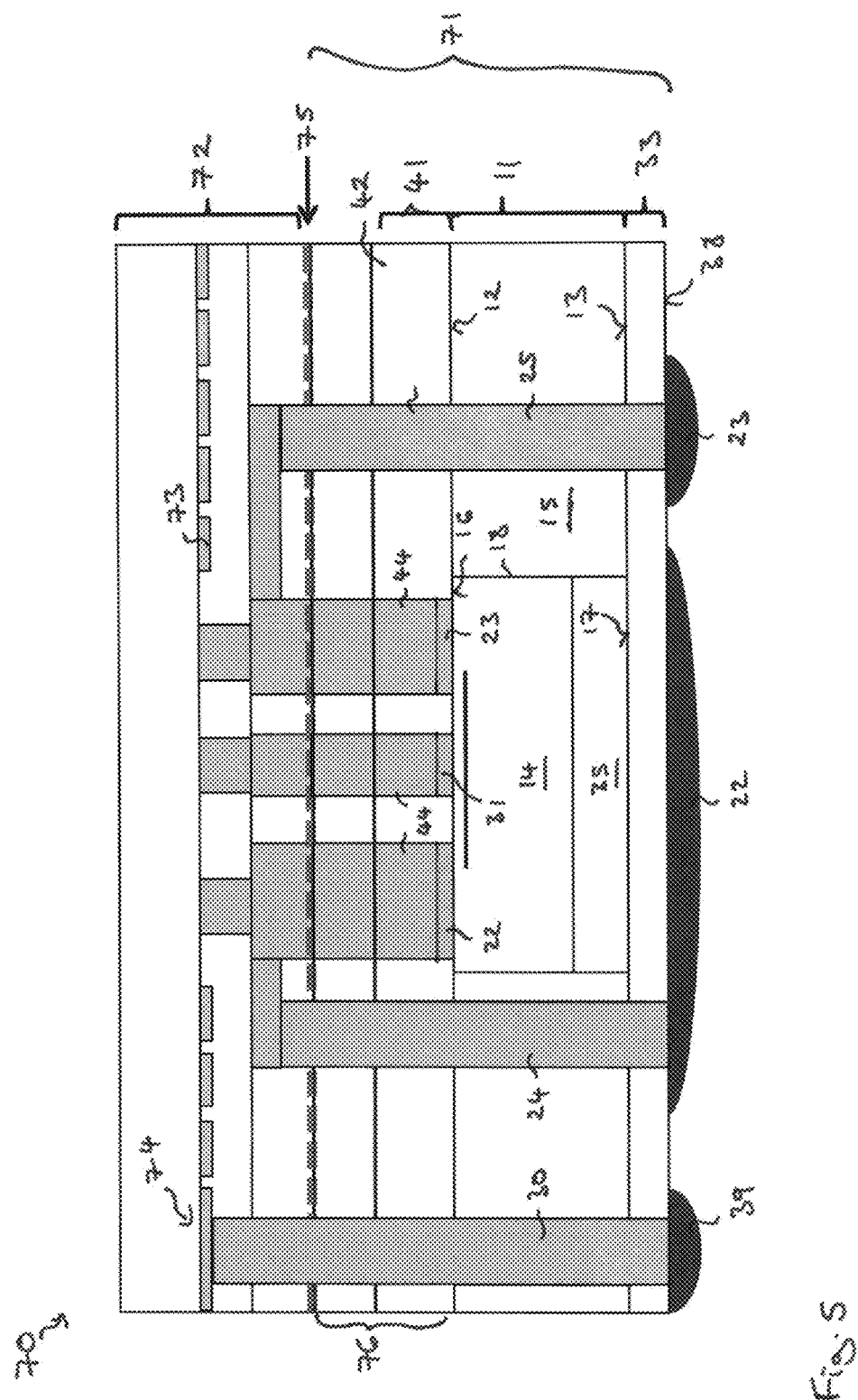
FIG. 5 illustrates a cross-sectional view of a semiconductor device according to an embodiment.

FIG. 5 illustrates a semiconductor device 70 including a base semiconductor device 71 comprising composite layer 11 with a Group III nitride-based mesa 14 having side faces 18 embedded in the first insulating layer 15 and a semiconductor wafer 72 which is bonded to the base semiconductor device 71. The semiconductor wafer 72 includes one or more semiconductor devices 73 and a conductive redistribution structure 74. The interface between the semiconductor wafer 72 and the base semiconductor wafer 71 is indicated by the dashed line 75. As can be seen in FIG. 5 by the position of the interface, the conductive redistribution structure 74 for the devices in the semiconductor wafer 72 is fabricated on the semiconductor wafer 72. The base semiconductor device 71 also includes a conductive redistribution structure 76 which is fabricated on the first surface 12 of the composite structure 11. Electrical connections are formed between the semiconductor wafer 72 and the base semiconductor device 71 and, in particular, between the redistribution structures 74 and 76. Also illustrated in FIG. 5, is an electrical connection between the semiconductor devices 73 within the semiconductor wafer 72 and an outer contact 77 positioned on the opposing second side 13 of the composite layer 11.

In some embodiments, the base semiconductor device 71 includes a base substrate 35 and a mesa island structure 14 formed from a Group III-N epitaxial layer with multiple sublayers to form a multilayer Group III nitride-based structure. The substrate 35 may be silicon. The mesa island structure 14 may be less than 20 µm thick or less than 10 µm thick. The wafer 72 is of another technology such as CMOS or BiCMOS. The semiconductor layers of the mesa island structure 14 may be formed substantially of III-N semiconductor materials, such as GaN, AlN, InN and alloys of these compounds. The active semiconductor devices in the mesas are transistors, such as a HEMTs, MISFETs, MIS-HEMTs or JFETs. The active or passive semiconductor devices may operate at a frequency higher than 800 MHz. In some embodiments, active or passive devices can extend over one or more island structures.

In some embodiments, the active or passive semiconductor devices are MMICs that include at least one transistor and one passive component, such as a capacitor, inductor or transmission line.

The semiconductor device 70 may be formed from a composite or hybrid wafer structure including a first wafer 71 with a Group III-N epi layer or structure and a substrate 35 that is thinner than 20 µm that is connected to a second wafer 72 of a different technology face-to-face. The first wafer 71 with the Group III-N epi layer or structure may include a substrate that is thinner than 10 µm or thinner than 6 µm and be connected to a second wafer 72 of a different technology face-to-face. In some embodiments, the first wafer 71 with III-N epi layer may include no substrate, i.e. a foreign substrate underneath the Group III-N epi, as the growth substrate has been completely removed. This first substrate-free wafer is connected to a second wafer 72 of a different technology face-to-face.

In III-V semiconductor devices formed on a foreign substrate such as silicon, a parasitic conductive channel can form at the interface between the substrate and the III-V semiconductor device. Coupling between an electrode of the device, such as a drain electrode in the case of a transistor device, and these parasitic electron or hole channels can lead to losses and limit performance.

In Group III nitride-based transistors formed on a foreign substrate comprising a different material, such as silicon, a parasitic conductive electron or hole channel can form at the interface between the substrate and the Group III nitride structure. This parasitic electron or hole channel may be caused by the polarization of the Group III nitride layers to form charges and electrostatic attraction of the charges by the drain electrode of the transistor. Coupling between the drain electrode and these parasitic electron or hole channels can lead to RF losses. Epitaxial Group III nitride-based multilayer structures, such as those described above which are used for HEMTs, have large polarization charges and are epitaxially grown at high temperature. Consequently, the inclusion of a parasitic channel suppression region can be particularly beneficial for Group III nitride-based multilayer structures.

In semiconductor devices including a composite layer 11 having a mesa 14 comprising Group III nitride material embedded in an insulating material, parasitic electron or hole channels may form at the interface between the Group III-N semiconductor material and the insulating material as well as at the interface between the III-N semiconductor and the support substrate. In some embodiments, a further parasitic channel suppression region is provided in the semiconductor device in order to reduce the effect of these parasitic charge channels.

The parasitic channel suppression region is used assist in hindering or suppressing the mobility of charges and/or reducing the charge density at the interface between the insulating material and the support substrate and/or at the interface between the insulating material and the III-V semiconductor, for example at the side faces of a mesa formed by a multi-layer stack of III-V semiconductor layers.

FIG. 6 illustrates an embodiment of semiconductor device 10' corresponding to that of FIG. 1 whereby like reference numerals indicate like features. The semiconductor device 10' includes a parasitic channel suppression region 80 which in the illustrated embodiment is positioned at the interface 81 between the side faces 18 of the mesa 14 and the first insulating layer 15. The parasitic channel suppression region 80 may comprise an amorphous layer or polycrystalline layer or a high defect density region. In some embodiments, the parasitic channel suppression region comprises implanted species. The species may comprise at least one of the group consisting of Ar, Kr, Xe, Ne, He, N, O, H, Fe, C, Si and Al. The species may comprise ions of at least one of the group consisting of Ar, Kr, Xe, Ne, He, N, O, H, Fe, C, Si and Al.

In some embodiments, the species may be implanted at two or more different energies in order to increase the implantation depth and thickness of the parasitic channel suppression region 80. In a particular example, the species are Ar+ ions, which are implanted at an energy in the range of 20 keV to 250 keV with an implantation dose of $1e^{13}$ $cm^{-2}$ to $5e^{15}$ $cm^{-2}$ or $1e^{14}$ $cm^{-2}$ to $5e^{15}$ $cm^{-2}$. In one example, the species are implanted with an ion implantation dose of $3e^{14}$ $cm^{-2}$ at 50 keV and $3e^{14}$ $cm^{-2}$ at 250 keV.

In some embodiments, the parasitic channel suppression region 80 is positioned in the Group III nitride material of the mesa 14, for example, at the side faces 18 and forms the side faces 18 of the mesa 14. In other embodiments, an additional layer is formed on the Group III nitride side faces 18 of the mesa 14.

In some embodiments, the lower surface 17 of the mesa 14 also comprises a parasitic channel suppression region 80 which may be formed in or on the Group III nitride-based material. In embodiments in which the Group III nitride-based material forms part of the second surface 13 of the composite layer 11, the parasitic channel suppression region 80 is coplanar with the second surface 13 of the insulating layer 15. In embodiments in which the mesa 14 includes a silicon base substrate 35, the parasitic channel suppression region 80 may be formed at the interface between the upper surface 36 of the silicon base substrate 35 and the Group III nitride-based multilayer structure. In embodiments including a silicon base substrate, the channel suppression region 80 may also be formed on the side faces of the silicon base substrate 35 and side faces of the Group III nitride-based multilayer structure. In some embodiments, the parasitic channel suppression region can also be formed at the lower surface 28 of the first insulating layer 15.

In some embodiments, a parasitic channel suppression region 80 is provided that is highly resistive so that free charges are prevented or hindered from moving. In these embodiments, the parasitic channel suppression provides a charge mobility reduction region. The charge mobility reduction region may include an amorphous layer or region, a polycrystalline layer or region or a high defect layer or region. The charge mobility reduction region may also include a combination of amorphous and/or polycrystalline portions.

In some embodiments, a parasitic channel suppression region is provided that reduces the charge density by providing a charge density reduction region. The charge density reduction region may include traps for trapping free charges, thus preventing the formation of a parasitic conductive electron or hole channel.

In some embodiments, parasitic channels are suppressed using a combination of charge traps, to reduce the density of free charges, and a highly resistive region to prevent movement of free charges.

FIG. 7 illustrates a flowchart 90 of a method of fabricating a semiconductor device. The method may be used to fabricate the semiconductor device according to any one of the embodiments described herein.

In block 91, a multilayer Group III nitride structure is epitaxially grown on a first surface of a substrate, the first surface being capable of supporting the epitaxial growth of at least one Group III nitride layer. In block 92, portions of the multilayer Group III nitride structure are removed to form at least one mesa arranged on the first surface, each mesa comprising the epitaxial Group III nitride-based multilayer structure and being laterally spaced part by a portion of the substrate. In block 93, insulating material is applied to the first surface of the substrate so that side faces of the mesa are embedded in the insulating material. In block 94, a first electrode is formed on the top surface of the mesa. In block 95, a first via is formed in the insulating material, the first via extending from the top surface of the insulating material to the first surface of the substrate. In block 96, conductive material is inserted into the first via to form a first conductive via. In block 97, an electrically conductive redistribution structure is applied to the upper surface and the first conductive via is electrically connected to the first electrode. In block 98, portions of a second surface of the substrate are successively removed, the second surface opposing the first surface, the insulating material is exposed and a worked second surface is formed that comprises the insulating material.

In this method, the first via is inserted into the insulating material to form a via, which may be thought of as a bare via, with side walls formed of the material of the insulating layer. This method is in contrast to methods in which the via is inserted into semiconductor material to from a bare via, since the side walls of such a bare via are formed of the semiconductor material. These side walls formed of semiconductor material are then coated with insulating material to insulate the centre of the via from the surrounding semiconductor material.

In some embodiments, the order of the method steps may be changed such that the method of block 98 is carried after the method of block 94 and before the method of block 96. In these embodiments, after the first electrode is formed on the top surface of the mesa, the portions of a second surface of the substrate are successively removed to expose the insulating material and form a second surface that comprises the insulating material. The first via is then formed in the insulating material such that it extends from the top surface of the insulating material to the second surface that is also formed of the insulating material. The conductive material is inserted into the first via to form a first conductive via and the electrically conductive redistribution structure is applied to the upper surface and the first conductive via is electrically connected to the first electrode. In this embodiment, the via is formed only in the insulating material and is not formed in the material of the substrate, for example monocrystalline silicon, in addition to not being formed in the Group III-nitride based multilayer structure.

In embodiments including two or more vias, each via may be formed using the same process as the first via.

In some embodiments, the method further comprises planarising the insulating material after its deposition to form an upper surface comprising a top surface of the mesa and a top surface of the insulating material.

In some embodiments, the method further comprising successively removing portions of a second surface of the substrate such that in addition to the insulating material the material in the first conductive via is exposed.

In some embodiments, the thickness of the substrate is reduced to a thickness t, the multilayer Group III nitride structure having a thickness $t_n$, wherein $t \leq t_n$ and $0 \, \mu m \leq t \leq 20 \, \mu m$, $0 \, \mu m \leq t \leq 5 \, \mu m$ or $0.1 \, \mu m \leq t \leq 20 \, \mu m$, or $0.1 \, \mu m \leq t \leq 1 \, \mu m$ or $1 \, \mu m \leq t \leq 2 \, \mu m$.

When the substrate is removed entirely, t=0. In these embodiments, the second surface of the composite layer comprises an island formed of Group III nitride that is laterally surrounded by the material of the insulating layer.

When t>0, the second surface includes an island formed of the material of the base substrate laterally surrounded by the insulating material, as the insulating material is exposed in the worked or new second surface by the successive removal of portions of the second surface of the substrate.

In some embodiments, the method further comprises removing portions of the first surface of the substrate such that an interface between the first surface of the substrate and the epitaxial Group III nitride-based multi-layer structure is positioned in and extends across a width of the mesa. By removing portions of the first surface of the substrate, the first surface of the substrate includes protruding islands formed of the material of the substrate that are positioned at the base of the mesa or islands of Group III nitride material. In these embodiments, after successively removing portions of the second surface, the worked second surface further comprises a region of the substrate laterally bounded by the insulating material.

In some embodiments, the method further comprises bonding a semiconductor wafer to the upper surface, wherein the semiconductor wafer is a bare semiconductor wafer or the semiconductor wafer comprises at least one semiconductor device, wherein, optionally, the at least one semiconductor device is electrically coupled to the Group III nitride-based device. The semiconductor wafer may be a silicon single crystal wafer or a silicon monocrystalline wafer. The semiconductor wafer may comprise a monocrystalline epitaxial silicon layer on a silicon single crystal wafer. In some embodiments, the semiconductor wafer may comprise <100> silicon and the substrate <111> silicon.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a composite layer having a first surface and a second surface opposing the first surface, the composite layer comprising a mesa and a first insulating layer, the mesa having a top surface, a bottom surface and side faces, the side faces being embedded in the first insulating layer, wherein the mesa comprises a Group III nitride-based multilayer structure that provides a Group III nitride based device having a first electrode and a second electrode that are arranged on the top surface of the mesa, and the first insulating layer is formed of oxide and/or nitride material;
   an insulating material positioned on the second surface of the composite layer;
   a first outer contact positioned on the insulating material;
   a second outer contact positioned on the insulating material;
   a first conductive via extending through the first insulating layer and the insulating material, the first conductive via being electrically coupled to the first electrode on the top surface of the mesa and to the first outer contact positioned on the insulating material; and
   a second conductive via extending through the first insulating layer and the insulating material, the second conductive via being electrically coupled to the second electrode on the top surface of the mesa and to the second outer contact positioned on the insulating material, wherein the first outer contact comprises a metallic layer, one or more conductive bumps arranged on the metallic layer, and solder positioned on the conductive bumps.

2. The semiconductor device of claim 1, wherein the mesa further comprises a foreign base substrate, the foreign base substrate having an upper surface capable of supporting epitaxial growth of at least one Group III nitride and a lower surface forming the bottom surface of the mesa, wherein the Group III nitride-based multilayer structure is epitaxially formed on the upper surface of the foreign base substrate.

3. The semiconductor device of claim 2, wherein the foreign base substrate has a thickness a thickness t, wherein the Group III nitride-based multilayer structure has a thickness $t_n$, and wherein $t \leq t_n$, and $0 \, \mu m \leq t \leq 20 \, \mu m$, or $0 \leq t \leq 5 \, \mu m$ or $0.1 \, \mu m \leq t \leq 2 \, \mu m$ or $1 \, \mu m \leq t \leq 2 \, \mu m$.

4. The semiconductor device of claim 1, wherein the first surface of the composite layer comprises the top surface of the mesa and a top surface of the first insulating layer, and wherein the second surface of the composite layer comprises the bottom surface of the mesa and a bottom surface of the first insulating layer.

5. The semiconductor device of claim 1, wherein the Group III nitride based device is a transistor device comprising a source electrode, a drain electrode and a gate electrode, wherein the first electrode provides the source electrode, and wherein the second electrode provides the drain electrode.

6. The semiconductor device of claim 5, further comprising a third conductive via positioned in the first insulating layer, wherein the third conductive via is coupled to the gate electrode and to a third outer contact positioned on the second surface of the composite layer.

7. The semiconductor device of claim 1, further comprising a first conductive redistribution layer arranged on the first surface of the composite layer, wherein the first conductive redistribution layer comprises:
a second insulating layer on the first surface of the composite layer;
a first lateral conductive redistribution structure on the second insulating layer;
a fourth conductive via extending through the second insulating layer that electrically couples the first electrode of the Group III nitride-based device to the first lateral conductive redistribution structure; and
a fifth conductive via that electrically couples the first lateral conductive redistribution structure to the first conductive via.

8. The semiconductor device of claim 1, wherein the first outer contact extends over the bottom surface of the mesa.

9. The semiconductor device of claim 1, further comprising a semiconductor wafer arranged on the first surface of the composite layer.

10. The semiconductor device of claim 9, wherein the semiconductor wafer comprises at least one semiconductor device and a redistribution structure that is electrically coupled to the semiconductor device, and wherein the semiconductor device is a CMOS device, or a bipolar device, or a passive device, or passive devices for impedance matching, or active devices as a pre-driver, a low noise amplifier or full receive path or CMOS logic for digital signal processing.

11. The semiconductor device of claim 1, further comprising a parasitic channel suppression region positioned at the interface between the side faces of the mesa and the first insulating layer and/or in the mesa and/or at the bottom surface of the mesa, wherein the parasitic channel suppression region comprises an amorphous layer or a polycrystalline layer or a high-defect density region.

12. The semiconductor device of claim 11, wherein the parasitic channel suppression region further comprises implanted species, and wherein the implanted species comprise at least one selected from the group consisting of Ar, Kr, Xe, Ne, He, N, O, H, Fe, C, Si and Al.

13. The semiconductor device of claim 1, wherein the first electrode on the top surface of the mesa and the first outer contact positioned on the insulating material are at a same first potential, wherein the second electrode on the top surface of the mesa and the second outer contact positioned on the insulating material are at a same second potential, and wherein the first potential is different than the second potential.

* * * * *

UNITED STATES PATENT AND TRADEMARK OFFICE
CERTIFICATE OF CORRECTION

PATENT NO. : 11,817,482 B2
APPLICATION NO. : 16/997980
DATED : November 14, 2023
INVENTOR(S) : H. Brech et al.

It is certified that error appears in the above-identified patent and that said Letters Patent is hereby corrected as shown below:

On the Title Page

Item (57)/Abstract, Line 7 please change "nitride based" to -- nitride-based --

In the Claims

Column 18, Line 51 (Claim 1) please change "nitride based" to -- nitride-based --

Column 19, Line 15 (Claim 3) please change "a thickness a thickness" to -- a thickness --

Column 19, Line 26 (Claim 5) please change "nitride based" to -- nitride-based --

Signed and Sealed this
Twentieth Day of February, 2024

Katherine Kelly Vidal
*Director of the United States Patent and Trademark Office*